(12) United States Patent
Shim et al.

(10) Patent No.: US 11,246,234 B2
(45) Date of Patent: Feb. 8, 2022

(54) DISPLAY DEVICE

(71) Applicant: Samsung Display Co., Ltd., Yongin-si (KR)

(72) Inventors: Byoung Yul Shim, Hwaseong-si (KR); Jin Ho Lee, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 316 days.

(21) Appl. No.: 16/109,770

(22) Filed: Aug. 23, 2018

(65) Prior Publication Data
US 2019/0215974 A1 Jul. 11, 2019

(30) Foreign Application Priority Data
Jan. 10, 2018 (KR) .......................... 10-2018-0003230

(51) Int. Cl.
| | |
|---|---|
| *H05K 5/02* | (2006.01) |
| *B41M 3/00* | (2006.01) |
| *H05K 5/00* | (2006.01) |
| *H05K 5/03* | (2006.01) |
| *H04M 1/02* | (2006.01) |

(52) U.S. Cl.
CPC .......... *H05K 5/0243* (2013.01); *B41M 3/003* (2013.01); *H04M 1/02* (2013.01); *H04M 1/0266* (2013.01); *H04M 1/0283* (2013.01); *H05K 5/0017* (2013.01); *H05K 5/0252* (2013.01); *H05K 5/03* (2013.01)

(58) Field of Classification Search
CPC .................................................... H04M 1/0283
See application file for complete search history.

(56) References Cited

U.S. PATENT DOCUMENTS

2014/0335316 A1* 11/2014 Fukushima ............... B32B 7/12
428/161

FOREIGN PATENT DOCUMENTS

KR 10-1778235 9/2017

* cited by examiner

*Primary Examiner* — Ian A Rummel
(74) *Attorney, Agent, or Firm* — H.C. Park & Associates, PLC

(57) ABSTRACT

Provided are a display device and a method of manufacturing a display device. The display device includes a window; a decorative print pattern disposed on the window; a shielding layer disposed on the decorative print pattern; a transparent printing layer disposed on the shielding layer; and an infrared printing layer disposed on the transparent printing layer and not in contact with the decorative print pattern, wherein the decorative print pattern and the shielding layer include a first opening exposing the window and the transparent printing layer and the infrared printing layer overlap the first opening.

18 Claims, 11 Drawing Sheets

DISPLAY DEVICE

CROSS-REFERENCE TO RELATED APPLICATION

This application claims priority from and the benefit of Korean Patent Application No. 10-2018-0003230, filed on Jan. 10, 2018, which is hereby incorporated by reference for all purposes as if fully set forth herein.

BACKGROUND

Field

Exemplary embodiment/implementation of the invention relate to a display device and a method of manufacturing a display device.

Discussion of the Background

A display device is a device capable of displaying an image and has been applied to various products based on a smart phone. Recently, as the functions of the display device are diversified, the display device includes optical sensors such as an iris recognition sensor and a proximity sensor as well as a photographing device for photographing pictures and moving images.

For example, the display device may recognize the iris of a user using an optical sensor and compare the recognized iris with a stored value to determine whether to activate the display device. Further, the display device may detect a change in light quality around the display device using the optical sensor, thereby adjusting brightness of a display screen or inactivating the display device.

Meanwhile, the display device has a hole formed in a decorative print pattern of a window and an infrared ink layer arranged to overlap the hole so as to easily transmit and receive an optical signal of the optical sensor.

The above information disclosed in this Background section is only for understanding of the background of the inventive concepts, and, therefore, it may contain information that does not constitute prior art.

SUMMARY

Exemplary embodiments of the invention provide a display device in which an infrared ink layer is not viewed from the outside of the display device without interfering with transmission/reception of an optical signal.

Additional features of the inventive concepts will be set forth in the description which follows, and in part will be apparent from the description, or may be learned by practice of the inventive concepts.

An embodiment of a display device includes a window; a decorative print pattern disposed on the window; a shielding layer disposed on the decorative print pattern; a transparent printing layer disposed on the shielding layer; and an infrared printing layer disposed on the transparent printing layer and not in contact with the decorative print pattern, the decorative print pattern and the shielding layer include a first opening exposing the window and the transparent printing layer and the infrared printing layer overlap the first opening.

The transparent printing layer may cover an inner side wall of the decorative print pattern and an inner side wall of the shielding layer.

A side surface of the transparent printing layer may be disposed on the shielding layer.

The infrared printing layer may be in contact with the shielding layer.

The infrared printing layer may not be in contact with the shielding layer.

A side surface of the infrared printing layer may be disposed on the shielding layer.

The decorative print pattern may include a first decorative printing layer and a second decorative printing layer which may be sequentially stacked on the window, and the transparent printing layer may cover an inner side wall of the first decorative printing layer, an inner side wall of the second decorative printing layer, and the inner side wall of the shielding layer.

A side surface of the infrared printing layer may be disposed outside the inner side wall of the first decorative printing layer based on the first opening, from a cross sectional view.

The side surface of the infrared printing layer may be disposed between the inner side wall of the first decorative printing layer and the inner side wall of the shielding layer, from a cross sectional view.

The decorative print pattern and the shielding layer may further include a second opening and a third opening that expose the window and are spaced apart from each other, and the transparent printing layer and the infrared printing layer may overlap the second opening and the third opening.

The transparent printing layer may include a first region overlapping the second opening and a second region overlapping the third opening, and the first region and the second region may be continuously connected to each other.

The infrared printing layer may include a third region overlapping the second opening and a fourth region overlapping the third opening, and the third region and the fourth region may be continuously connected to each other.

An embodiment of a display device includes a window; a decorative print pattern disposed on the window; a transparent printing layer disposed on the decorative print pattern; a shielding layer disposed on the transparent printing layer; and an infrared printing layer disposed on the shielding layer and not in contact with the decorative print pattern, wherein the decorative print pattern includes a first opening exposing the window, the shielding layer includes a second opening overlapping the first opening, and the transparent printing layer and the infrared printing layer overlap the first opening and the second opening.

The transparent printing layer may cover an inner side wall and one surface of the decorative print pattern.

A side surface of the infrared printing layer may be disposed on the shielding layer.

The decorative print pattern may include a first decorative printing layer and a second decorative printing layer which are sequentially stacked from the window, and the transparent printing layer may cover an inner side wall of the first decorative printing layer, an inner side wall of the second decorative printing layer, and one surface of the second decorative printing layer.

A side surface of the infrared printing layer may be disposed outside the inner side wall of the first decorative printing layer based on the first opening.

The side surface of the infrared printing layer may be disposed between the inner side wall of the first decorative printing layer and the inner side wall of the shielding layer.

An embodiment of a method of manufacturing a display device includes printing a decorative print pattern on a window and pre-drying the decorative print pattern; forming a shielding layer on the decorative print pattern and pre-drying the shielding layer; printing a transparent printing layer on the shielding layer and pre-drying the transparent printing layer; printing an infrared printing layer on the transparent printing layer and pre-drying the infrared printing layer; and drying the decorative print pattern, the shielding layer, the transparent printing layer, and the infrared printing layer.

A drying time of the drying may be longer than a time of the pre-drying.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
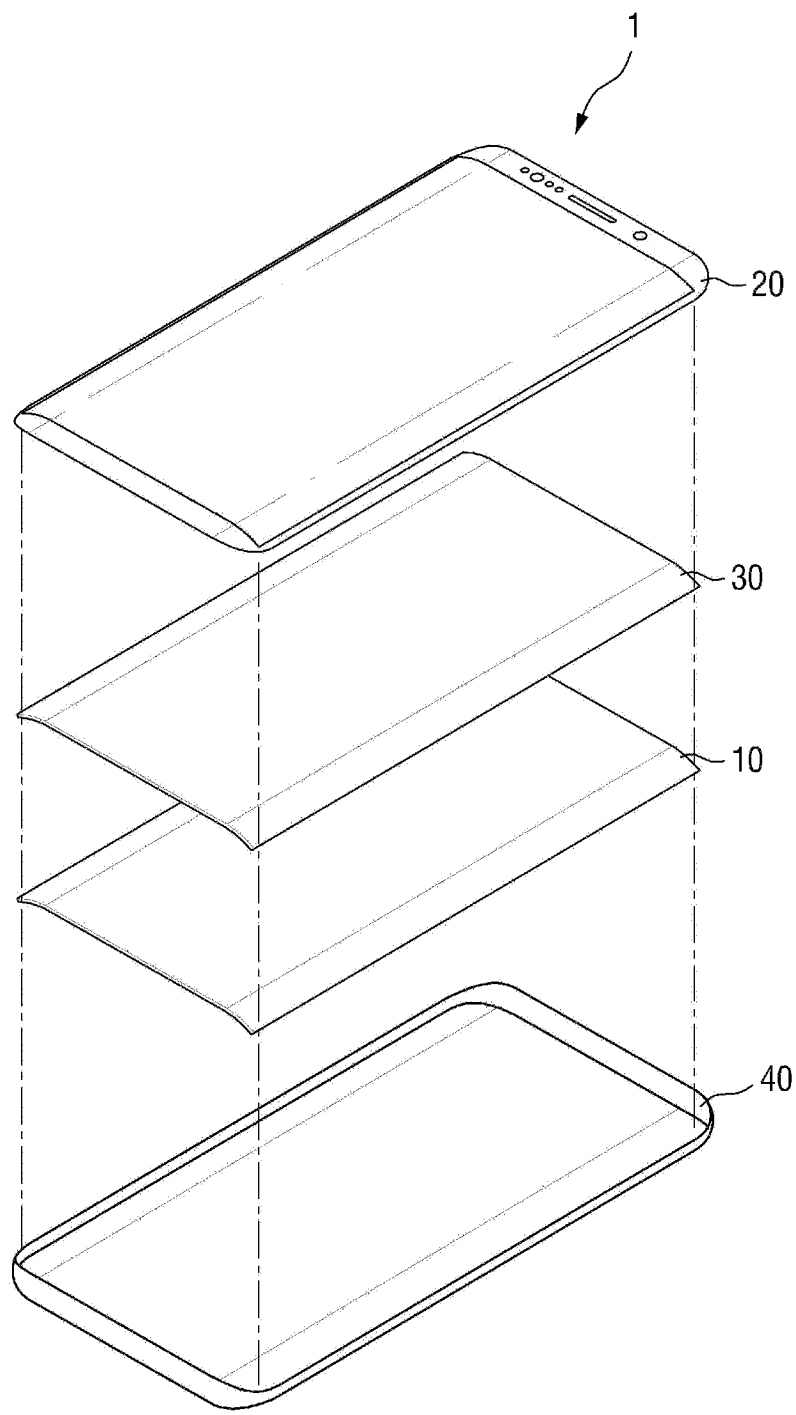
FIG. 1 is an exploded perspective view of a display device according to an exemplary embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is an exploded perspective view of a display device according to an exemplary embodiment.

FIG. 1 shows a portable terminal as an example to which a display device 1 according to an exemplary embodiment is applied. The portable terminal may be a tablet PC, a smart phone, a personal digital assistant (PDA), a wearable electronic device, and the like. However, the present invention is not limited thereto, and may be applied to small to medium electronic apparatuses, such as a personal computer, a notebook computer, a car navigation unit, and a camera as well as large electronic apparatuses such as televisions and external billboards. That is, of course, the present invention may be applied to other electronic devices without departing from the concept of the present invention.

Referring to FIG. 1, the display device 1 includes a display panel 10 and a window 20 disposed at the upper portion of the display panel 10. The display device 1 may further include a bracket 40 disposed at the lower portion of the window. Unless otherwise defined, in the present specification, the "upper portion", "upper surface" mean a display surface side based on top of the display panel 10, and the "lower portion" and "lower surface" mean an opposite side of the display surface based on the display panel 10.

The display device 1 is divided into a display area DA and a non-display area NDA. The display area DA is an area where an image is displayed, and the non-display area NDA is an area where the image is not displayed. The non-display area NDA is disposed around the display area DA. For example, when the display area DA is rectangular, the non-display area NDA may be arranged along four sides of the display area DA.

The display panel 10 is a panel for displaying, for example, an organic light emitting display panel 10 may be applied. In the following exemplary embodiment, it is illustrative that the organic light emitting display panel is applied as the display panel 10, but the present invention is not limited thereto, and other types of display panels such as a liquid crystal display panel and an electrophoretic panel may be applied.

The display panel 10 includes a plurality of organic light emitting elements arranged on a substrate. The substrate may be a rigid substrate made of glass or the like, or a flexible substrate made of polyimide or the like. When the polyimide substrate is applied as the substrate, the organic light emitting display panel 10 may be bent, curved, folded or rolled.

In an exemplary embodiment, a touch panel 30 may be disposed between the display panel 10 and the window 20. The touch panel 30 has substantially the same size as the display panel 10 and may overlap the display panel 10. The display panel 10 and the touch panel 30, and the touch panel 30 and the window 20 may be bonded to each other by an optical transparent adhesive (OCA), an optical transparent resin (OCR), or the like, respectively. In another exemplary embodiment, the touch panel 30 may be directly formed at the upper portion of the display panel 10. In this case, an adhesive member between the touch panel 30 and the display panel 10 may be omitted, and an adhesive member may be interposed only between the touch panel 30 and the window 20. Further, the touch panel 30 may also be omitted. In this case, the display panel 10 and the window 20 may be bonded to each other by the optical transparent adhesive (OCA), the optical transparent resin (OCR), or the like. In some exemplary embodiments, the display panel 10 may further include a touch electrode portion therein.

The display panel 10 and the touch panel 30 may be received in a bracket 40. The bracket 40 protects the internal structure of the display device 1 from the outside. The bracket 40 may have a rectangular box shape including a receiving area therein. That is, the bracket 40 includes four side surfaces and a bottom surface, and the display panel 10, the touch panel 30, and the like may be disposed in an inner space formed by the side surfaces and the bottom surface of the bracket 40.

The window 20 is disposed at the upper portion of the display panel 10. The window 20 is disposed at the upper portion of the display panel 10 to protect the display panel 10 from an external impact while transmitting light emitted from the display panel 10.

The window 20 may be disposed to overlap the display panel 10 and cover the entire surface of the display panel 10. The window 20 may be larger than the display panel 10 in size. For example, the window 20 may protrude outward from the display panel 10 at both short sides of the display device 1.

The window 20 may include transparent glass, or a transparent material such as polyethylene terephthalate, polyvinyl resin, polyester, and the like. However, the present invention is not limited thereto, and there is no limitation to a type of window 20 if the transmissivity is sufficient to transmit the light emitted from the display panel 10.

Hereinafter, the window 20 will be described with reference to FIGS. 2, 3, 4, and 5 for a more detailed description.

Figure 2:
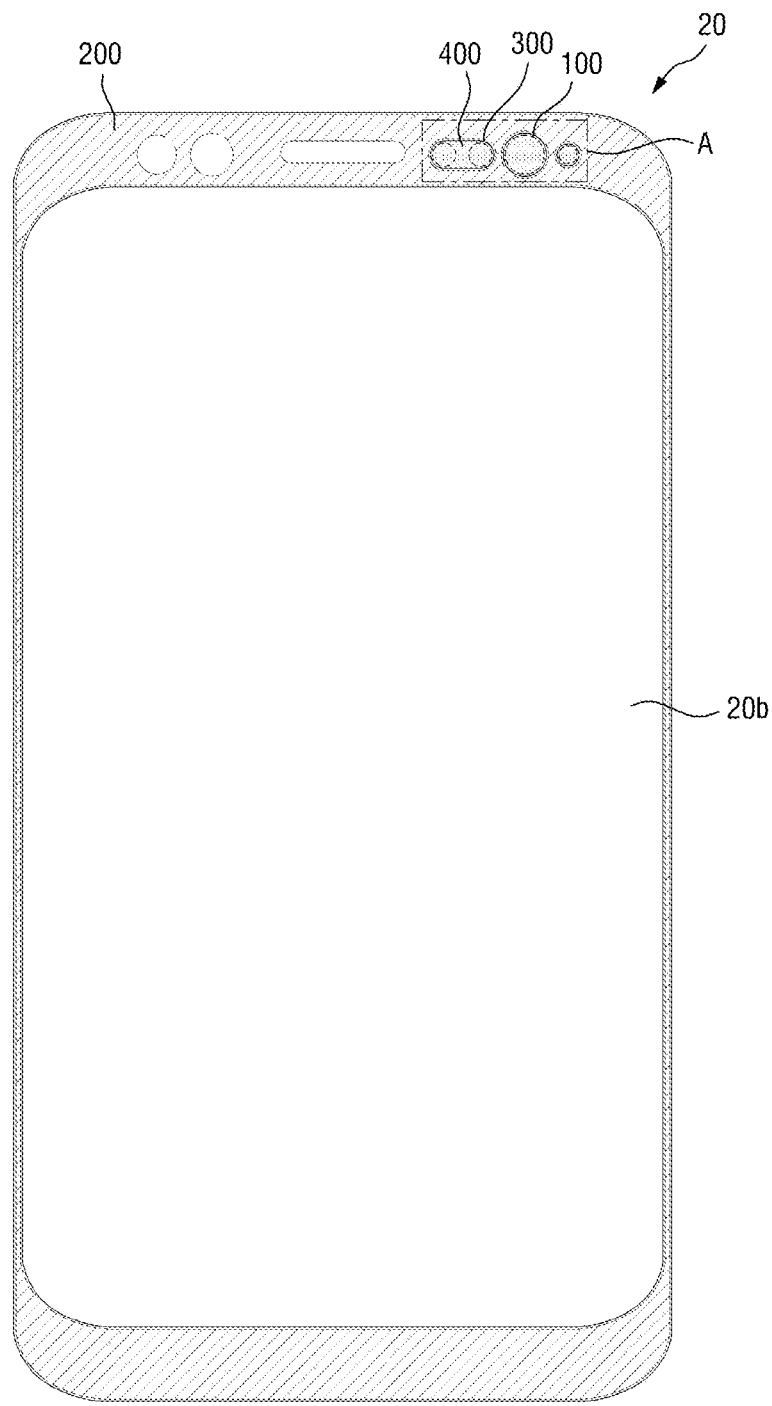
FIG. 2 is a bottom view of a window according to the exemplary embodiment.
Figure 3:
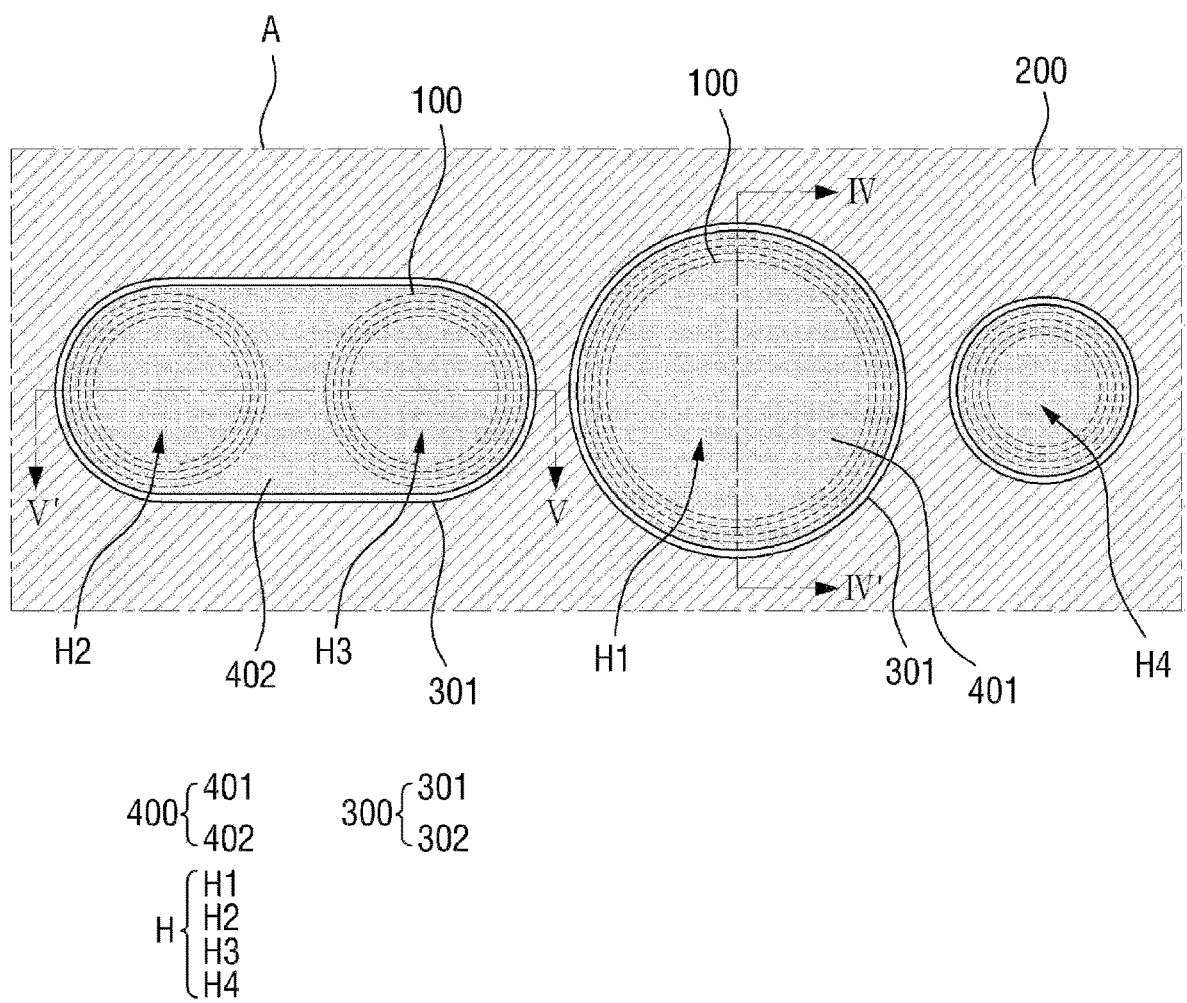
FIG. 3 is an enlarged view illustrating a region A in FIG. 2.
Figure 4:
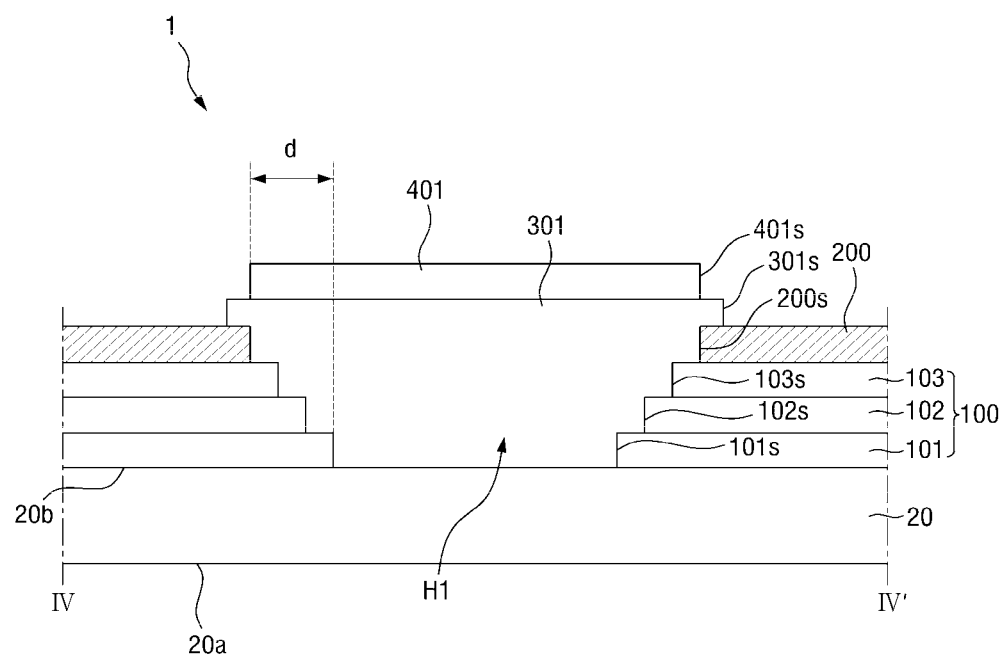
FIG. 4 is a cross-sectional view taken along line IV-IV' of FIG. 3.
Figure 5:
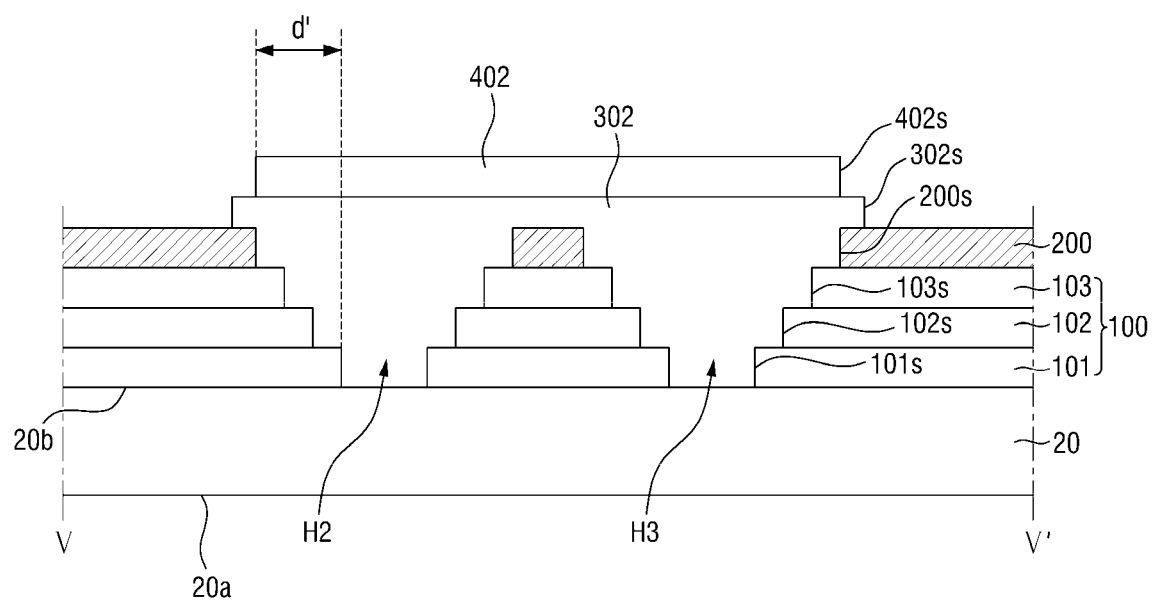
FIG. 5 is a cross-sectional view taken along line V-V' of FIG. 3.

FIG. 2 is a bottom view of a window according to the exemplary embodiment and FIG. 3 is an enlarged view illustrating a region A in FIG. 2. FIG. 4 is a cross-sectional view taken along line IV-IV' of FIG. 3 and FIG. 5 is a cross-sectional view taken along line V-V' of FIG. 3.

Referring to FIG. 2, a decorative print pattern 100 and a shielding layer 200 are disposed on a lower surface 20b of the window 20. The decorative print pattern 100 may be directly printed and formed on the window 20.

The decorative print pattern 100 absorbs or reflects the light incident from an upper surface 20a and/or a lower surface 20b of the window 20 and gives a color to a bezel of the display device 1. The decorative print pattern 100 may be continuously arranged along the non-display area NDA. In other words, the decorative print pattern 100 may be continuously arranged along the edge of the display area DA.

The decorative print pattern 100 may be expressed in an achromatic series of white, gray or black, or a chromatic series such as burgundy red, rose pink, and coral blue. Furthermore, the decorative print pattern 100 may include pearl particles, metal particles, and the like to express various textures. As such, the decorative print pattern 100 gives colors and various textures to the display device 1, thereby improving the aesthetic of the display device 1.

The decorative print pattern 100 includes a plurality of decorative printing layers stacked. In an exemplary embodiment, the decorative print pattern 100 may include a first decorative printing layer 101, a second decorative printing layer 102, and a third decorative printing layer 103. However, the present invention is not limited thereto and may include at least two or four decorative printing layers. The plurality of decorative printing layers 101 to 103 may be formed in the same color. When the plurality of decorative printing layers 101 to 103 having the same color are stacked, a clearer color may be displayed. For example, in the case of 3-degree printing, two decorative printing layers having the same color are stacked, which shows a clearer color than a 1-degree print in which one decorative printing layer is disposed.

The decorative print pattern 100 may also include decorative printing layers having different colors. For example, when the first decorative printing layer 101 and the second decorative printing layer 102 are light pink, the third decorative printing layer 103 is formed in white so that the first decorative printing layer 101 and the second decorative printing layer 102 may be more clearly expressed.

The decorative print pattern 100 may be formed in various methods such as screen printing, spray-UV exposure printing, silk printing, pad printing, and the like. In the following exemplary embodiments, the decorative print pattern 100 is formed by the pad printing method, but the present invention is not limited thereto.

A shielding layer 200 is formed at the lower portion of the decorative print pattern 100. The shielding layer 200 may be disposed to overlap the decorative print pattern 100, but may be smaller than the decorative print pattern 100 in size.

The shielding layer 200 blocks the light incident to the lower surface 20b of the window 20 from the display panel 10 in advance to prevent the incident light from being leaked through the decorative print pattern 100 and the window 20. Therefore, even if light having various wavelengths is incident from the display panel 10 of the display device 1, the light does not affect the color represented by the decorative print pattern 100 to maintain an original color.

The decorative print pattern 100 and the shielding layer 200 include a plurality of holes H. The plurality of holes H may include first to fourth holes H1 to H4. An optical sensor or the like may be disposed in the plurality of holes. The optical sensor may be a sensor that transmits and receives light having a specific wavelength. In an exemplary embodiment, the optical sensor may be a proximity sensor that recognizes external light to adjust the brightness of the display screen or inactivate the display device, or an iris sensor that recognizes the iris of the user. However, the type of sensor is not limited to the above example, and may include all sensors that control the display device by transmitting and receiving the light wavelength.

Side surfaces 101s to 103s of the first to third decorative printing layers 101 to 103 and an inner side wall 200s of the shielding layer 200 may be formed in a stepped shape in the first hole H1. Specifically, an inner side wall 102s of the second decorative printing layer 102 protrudes from an inner side wall 103s of the third decorative printing layer 103, and an inner side wall 101s of the first decorative printing layer 101 may protrude from the inner side wall 102s of the second decorative printing layer 102. In addition, the side surface of the decorative print pattern 100 protrudes from the inner side wall 200s of the shielding layer 200 to expose the lower surface of the decorative print pattern 100. Here, the side surface of the decorative print pattern 100 means a side surface of the decorative printing layer closest to the shielding layer 200 among the plurality of decorative printing layers 101 to 103. In the exemplary embodiment, the inner side wall 103s of the third decorative printing layer 103 may protrude outward from the inner side wall 200s of the shielding layer 200.

Like the first hole H1, in the second hole H2 to the fourth hole H4, the side surfaces 101s to 103s of the first to third decorative printing layers 101 to 103 and the inner side wall 200s of the shielding layer 200 may be formed in stepped shapes.

A transparent printing layer 300 and an infrared printing layer 400 may be disposed on the plurality of holes H. The transparent printing layer 300 is disposed between the decorative print pattern 100 and the infrared printing layer 400 to prevent the decorative print pattern 100 from contacting the infrared printing layer 400. A type of transparent printing layer 300 is not limited as long as a material has a transmittance sufficient to transmit the light transmitted and received by the optical sensor. However, the transparent printing layer 300 may include a material that is less permeable to the decorative print pattern 100 than the infrared printing layer 400.

The infrared printing layer 400 increases the sensing efficiency of the optical sensor. The infrared printing layer 400 may include a material having high transmittance in an infrared region where the wavelength of light is greater than about 780 nm but a material having low transmittance in a visible region having a wavelength of light between about 380 nm and about 780 nm.

The transparent printing layer 300 may include a first transparent printing layer 301 disposed in the first hole H1 and a second transparent printing layer 302 disposed over the second hole H2 and the third hole H3. The infrared printing layer 400 also includes a first infrared printing layer 401 disposed in the first hole H1 and a second infrared printing layer 402 disposed over the second hole H2 and the third hole H3.

The first transparent printing layer 301 is disposed so as to fill the inside of the first hole H1. Specifically, in the first hole H1, the first transparent printing layer 301 may be disposed to cover all of the side surfaces 101s to 103s of the first to third decorative printing layers 101 to 103 and the inner side wall 200s of the shielding layer 200 and further extend to the outside to cover a part of the lower surface of the shielding layer 200. That is, the side surfaces 101s to 103s of the first to third decorative print layers 101 to 103 and the inner side wall 200s of the shielding layer 200 may not be exposed to the outside from the lower surface 20b of the window 20.

The first infrared printing layer 401 is formed on the first transparent printing layer 301 and a width of the first infrared printing layer 401 may be equal to the width of the first transparent printing layer 301 or smaller than the width of the first transparent printing layer 301. That is, a side surface 401s of the first infrared printing layer 401 is disposed on the first transparent printing layer 301, and the first infrared printing layer 401 is not in direct contact with the decorative print pattern 100. Furthermore, the first infrared printing layer 401 may not be in direct contact with the shielding layer 200. In an exemplary embodiment, the side surface 401s of the first infrared printing layer 401 may be disposed to align with the inner side wall 200s of the shielding layer 200.

At least a part of the first infrared printing layer 401 is disposed to overlap the first decorative printing layer 101. That is, the side surface 401s of the first infrared printing layer 401 is located outside the inner side wall 101s of the first decorative printing layer 101 based on the first hole H1. A separation distance d between the side surface 401s of the first infrared printing layer 401 and the inner side wall 101s of the first decorative printing layer 101 may be 0.4 mm or more. If the separation distance d is 0.4 mm or more, most of the light transmitted and received through the first hole H1 passes through the first infrared printing layer 401, thereby increasing the sensing efficiency of the optical sensor.

Unlike the first transparent printing layer 301 and the first infrared printing layer 401, the second transparent printing layer 302 and the second infrared printing layer 402 may be disposed to cover both the second hole H2 and the third hole H3.

Specifically, the second transparent printing layer 302 may be disposed to cover all of the side surfaces 101s to 103s of the first to third decorative printing layers 101 to 103 and the inner side wall 200s of the shielding layer 200 and further extend to the outside to cover a part of the lower surface of the shielding layer 200. Furthermore, the second transparent printing layer 302 completely overlaps the first to third decorative printing layers 101 to 103 and the shielding layer 200 which are disposed between the second hole H2 and the third hole H3. In other words, the second transparent printing layer 302 includes a first area overlapping the second hole H2 and a second area overlapping the third hole H3, and the first area and the second area may be continuously connected to each other.

The second infrared printing layer 402 is formed on the second transparent printing layer 302 and overlaps the second hole H2 and the third hole H3. The second transparent printing layer 402 completely also overlaps the first to third decorative printing layers 101 to 103 and the shielding layer 200 disposed between the second hole H2 and the third hole H3. In other words, the second transparent printing layer 402 includes a third area overlapping the second hole H2 and a fourth area overlapping the third hole H3, and the third area and the fourth area may be continuously connected to each other.

The second infrared printing layer 402 is not in direct contact with the decorative print pattern 100 like the first infrared printing layer 401. That is, a side surface 402s of the second infrared printing layer 402 is disposed on the second transparent printing layer 302. That is, the side surface 402s of the second infrared printing layer 402 is located outside the inner side wall 101s of the first decorative printing layer 101 based on the second hole H2 and the third hole H3. A separation distance d' between the side surface 401s of the second infrared printing layer 402 and the inner side wall 101s of the first decorative printing layer 101 may be 0.4 mm or more.

In the case of the fourth hole H4, the transparent printing layer 300 and the infrared printing layer 400 may be disposed in the same manner as the first hole H1. That is, the infrared printing layer 400 is disposed on the transparent printing layer 300 and is not in direct contact with the decorative print pattern 100.

In the case of forming the decorative print pattern 100 by a pad printing method, generally, when the decorative printing layers 101 to 103 are formed, only a pre-drying process of drying for a short time is performed, and after the decorative printing layers 101 to 103, the shielding layer 200, the transparent printing layer 300, the infrared printing layer 400, and the like are formed, a drying process is preformed.

The decorative printing layers 101 to 103 subjected to only the pre-drying are not completely dried to be contaminated by foreign substances. For example, when the colored infrared printing layer 400 is in direct contact with the decorative printing layers 101 to 103, the infrared printing layer 400 may penetrate into the decorative printing layers 101 to 103. In this case, the color of the infrared printing layer 400 may be viewed as spots from the outside of the display device 1 and act as a factor for damaging the appearance of the display device 1. In particular, when the decorative printing layers 101 to 103 have bright colors such as white, the dark infrared printing layer 400 may be clearly viewed.

On the other hand, when the transparent printing layer 300 is disposed between the decorative printing layers 101 to 103 and the infrared printing layer 400, the transparent printing layer 300 is less permeable to the decorative printing layers 101 to 103 than the infrared printing layer 400 and has no effect on the decorative printing layers 101 to 103 because a specific color is exhibited. In addition, since the decorative printing layers 101 to 103 and the infrared printing layer 400 are not in direct contact with each other, the infrared printing layer 400 does not penetrate into the decorative printing layers 101 to 103 such that there is no concern that the infrared printing layer 400 may be viewed from the outside of the display device 1.

Hereinafter, another exemplary embodiment of the display device will be described. In the following exemplary embodiment, description of the same configuration as that of the exemplary embodiment described above will be omitted or simplified, and differences will be mainly described.

FIGS. 6, 7, 8, and 9 are cross-sectional views of windows according to various exemplary embodiments.

In FIGS. 6 to 9, decorative print patterns 100_2, 100_3, 100_4 and 100_5, shielding layers 200_2, 200_3, 200_4 and 200_5, first transparent printing layers 301_2, 301_3, 301_4 and 301_5 and first infrared printing layers 401_2, 401_3, 401_4 and 401_5 in first holes H1 of display devices 2, 3, 4 and 5 will be described in detail, but may be applied even to second holes H2 to fourth holes H4 in the same manner.

Figure 6:
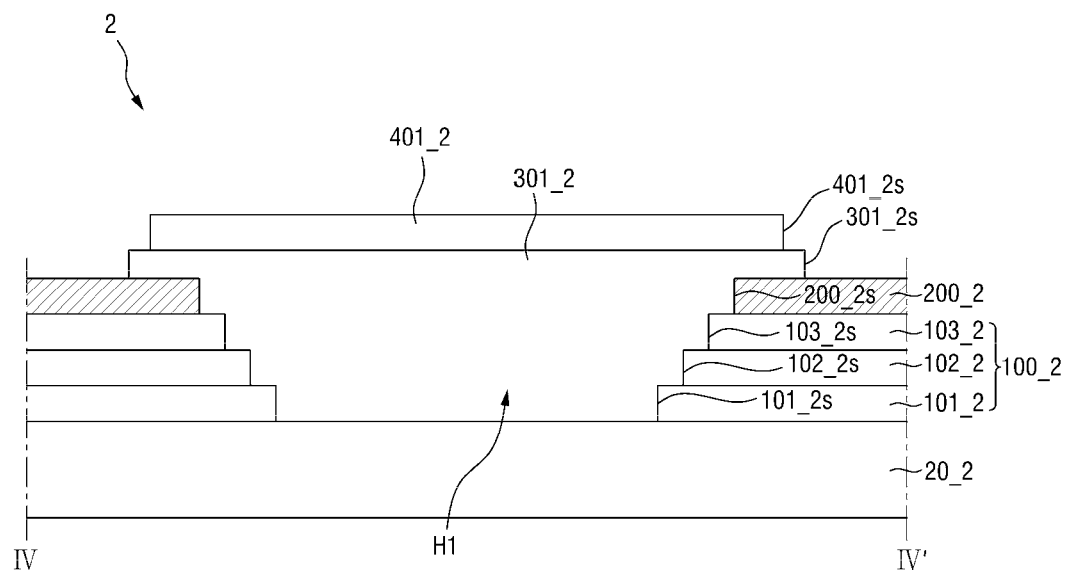
FIGS. 6, 7, 8, and 9 are cross-sectional views of windows according to various exemplary embodiments.

Referring to FIG. 6, there is a detailed difference from the exemplary embodiment of FIG. 4 in that the first infrared printing layer 401_2 of the display device 2 overlaps the shielding layer 200_2. Even in this case, the first infrared printing layer 401_2 is not in contact with the shielding layer 200_2.

The amount of light passing through the first infrared printing layer 401_2 increases as the first infrared printing layer 401_2 covers not only the first hole H1 but also the edge of the first hole H1. Accordingly, the efficiency of the light transmitted/received through the first hole H1 is improved, and as a result, the sensing efficiency may be further increased.

Figure 7:
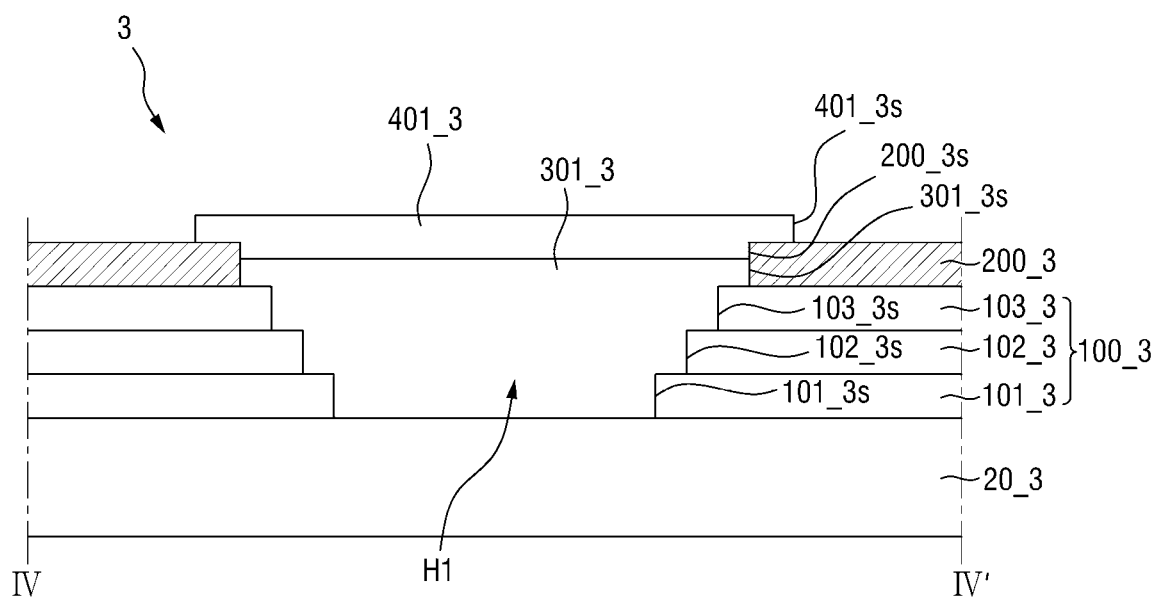

Referring to FIG. 7, a side surface 301_3s of the first transparent printing layer 301_3 of the display device 3 is aligned with an inner side wall 200_3s of the shielding layer 200_3, and there is a difference from the exemplary embodiment of FIG. 5 in that the first infrared printing layer 401_3 is in contact with the shielding layer 200_3.

Specifically, the first transparent printing layer 301_3 completely covers an inner side wall 101_3s of the first decorative printing layer 101_3, an inner side wall 102_3s of the second decorative printing layer 102_3, and an inner side wall 103_3s of the third decorative printing layer 103_3, but may cover only a part of the shielding layer 200_3s. Even in this case, the lower surfaces of the decorative printing layers 101_3, 102_3, and 103_3 are covered by the first transparent printing layer 301_3 so as not to be exposed to the outside. On the other hand, the lower surface of the shielding layer 200_3 does not overlap the first transparent printing layer 301_3.

The first infrared printing layer 401_3 is disposed on the first transparent printing layer 301_3. The first infrared printing layer 401_3 may be in direct contact with the shielding layer 200_3. Specifically, a side surface 401_3s of the first infrared printing layer 401_3 is disposed on the lower surface of the shielding layer 200_3, and the first infrared printing layer 401_3 is in contact with a part of the lower surface of the shielding layer 200_3. The shielding layer 200_3 is distant from the lower surface of the window 20_3 and has a dark color so that it is less likely to view the spots from the appearance of the display device 1 even if the first infrared printing layer 401_3 penetrates.

Figure 8:
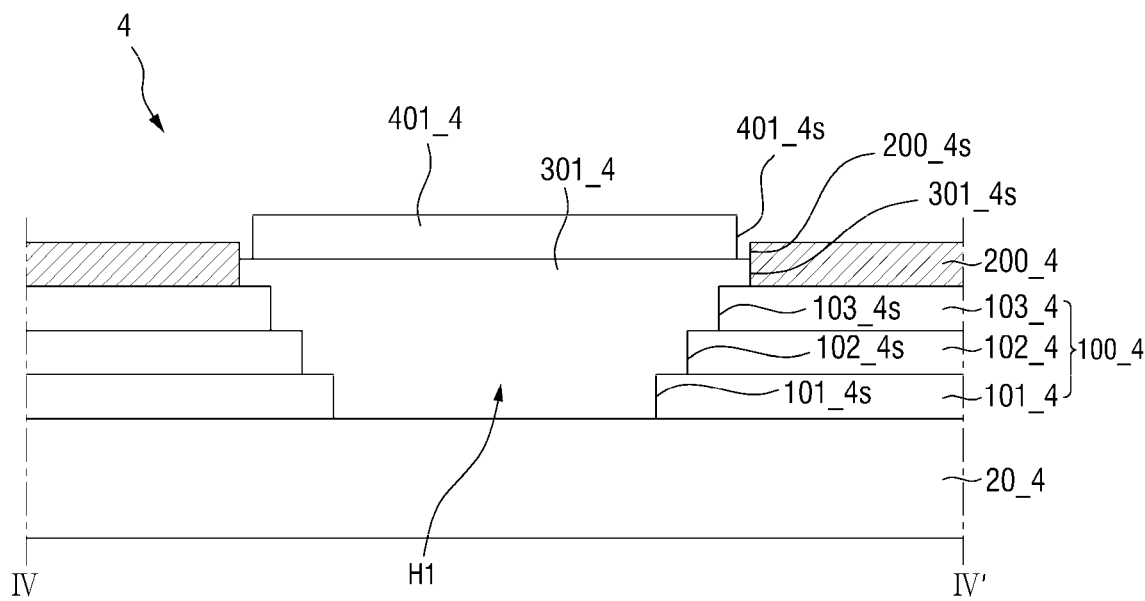

Referring to FIG. 8, a side surface 301_4s of the first transparent printing layer 301_4 of the display device 4 is aligned with an inner side wall 200_4s of the shielding layer 200_4, but there is a detailed difference from the exemplary embodiment of FIG. 7 in that the first infrared printing layer 401_4 is not in contact with the shielding layer 200_4.

Specifically, a side surface 401_4s of the first infrared printing layer 401_4 may be disposed inside the inner side wall 200_4s of the shielding layer 200_4 based on the center of the first hole H1. However, even in this case, the side surface 401_4s of the first infrared printing layer 401_4 should be disposed outside the inner side wall 101_4s of the first decorative printing layer 101_4. The side surface 401_4s of the first infrared printing layer 401_4 may be disposed between the inner side wall 200_4s of the shielding layer 200_4 and the inner side wall 101_4s of the first decorative printing layer 101_4.

Figure 9:
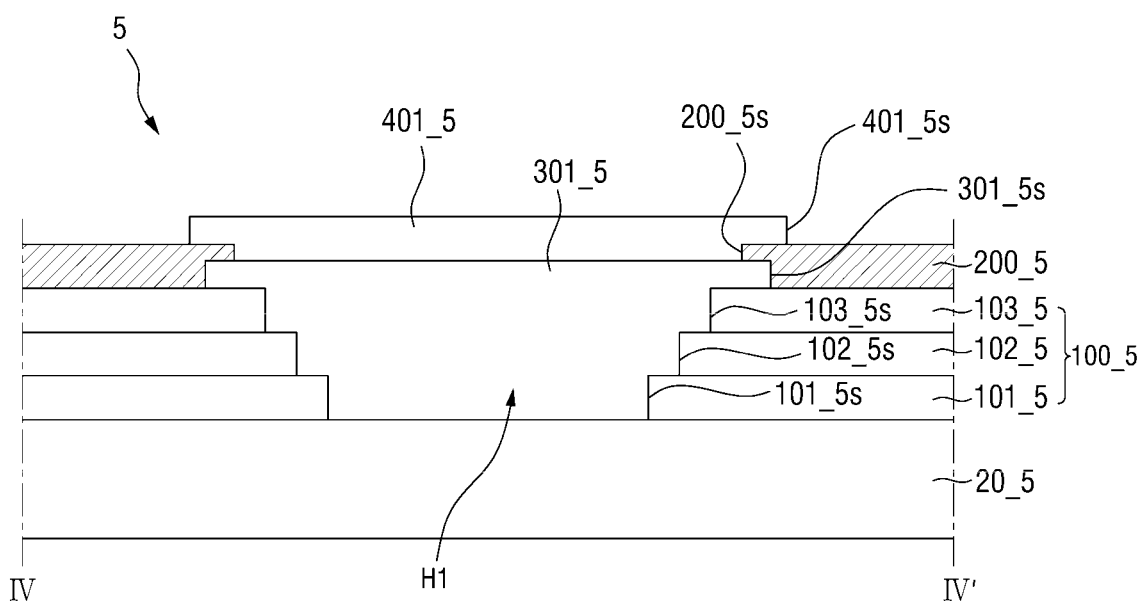

Referring to FIG. 9, there is a difference from the exemplary embodiment of FIG. 5 in that the shielding layer 200_5 of the display device 5 is disposed on the first transparent printing layer 301_5 and the first infrared printing layer 401_5 is disposed on the shielding layer 200_5.

Specifically, the first transparent printing layer 301_5 may cover an inner side wall 101_5s of the first decorative printing layer 101_5, an inner side wall 102_5s of the second decorative printing layer 102_5, and an inner side wall 103_5s of the third decorative printing layer 103_5, and further extend to the outside to cover a part of the lower surface of the third decorative printing layer 103_5.

The shielding layer 200_5 is disposed on the first transparent printing layer 301_5 to cover a side surface 301_5s of the first transparent printing layer 301_5 and cover a part of the lower surface of the first transparent printing layer 301_5.

The first infrared printing layer 401_5 is disposed on the shielding layer 200_5 to cover an inner side wall 200_5s of the shielding layer 200_5 and cover a part of the lower surface of the shielding layer 200_5. The first infrared printing layer 401_5 is in contact with a portion of the lower surface of the first transparent printing layer 301_5 that is not covered by the shielding layer 200_5. The first infrared printing layer 401_5 is in contact with the shielding layer 200_5 and the first transparent printing layer 301_5, but is not in direct contact with the decorative print pattern 100_5.

Although the first infrared printing layer 401_5 is disposed outside the inner side wall 200_5s of the shielding layer 200_5 in the drawing, the present invention is not limited thereto, and the first infrared printing layer 401_5 may be disposed between the inner side wall 101_5s of the first decorative printing layer 101_5 and the inner side wall 200_5s of the shielding layer 200_5.

Hereinafter, a method of manufacturing a display device according to an exemplary embodiment will be described with reference to FIGS. 10, 11, 12, 13, 14, 15, 16, and 17.

Figure 10:
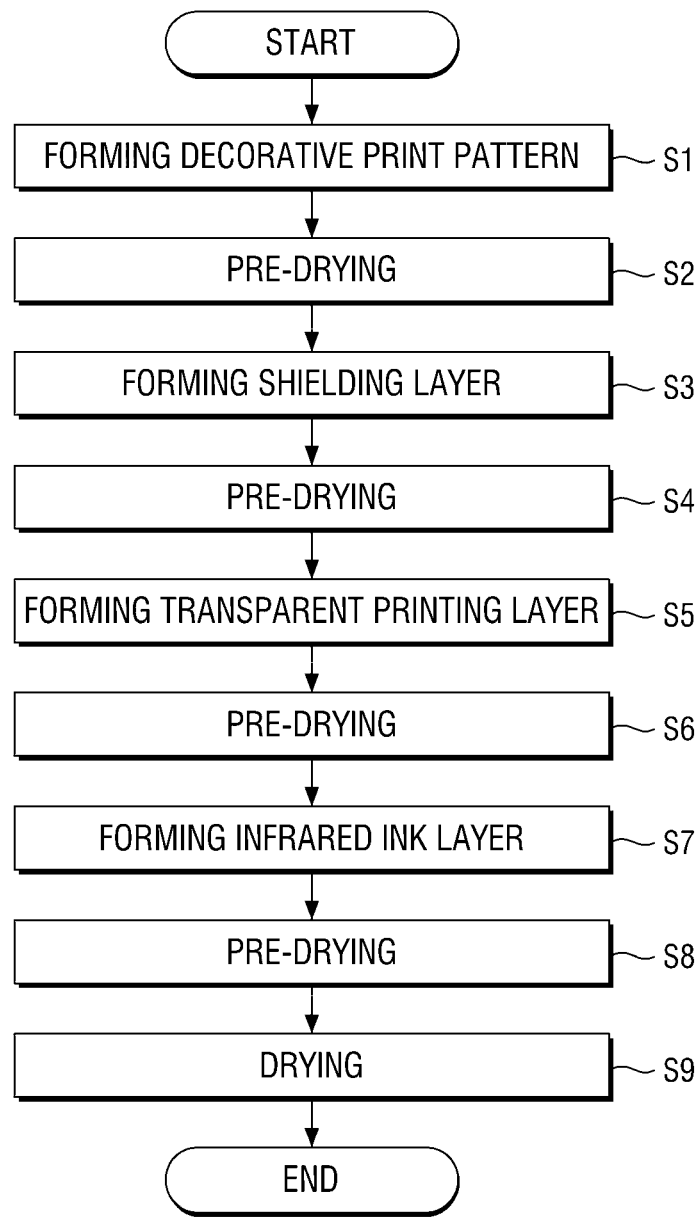
FIG. 10 is a flowchart illustrating a method of manufacturing a display device according to an exemplary embodiment.
Figure 11:
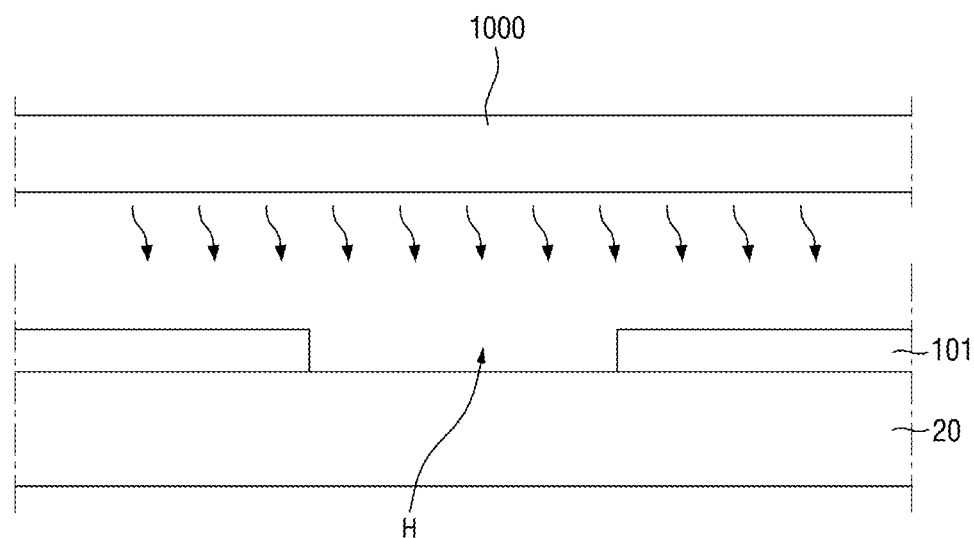
FIGS. 11, 12, 13, 14, 15, 16, and 17 are cross-sectional views illustrating a method of manufacturing a display device according to an exemplary embodiment.
Figure 12:
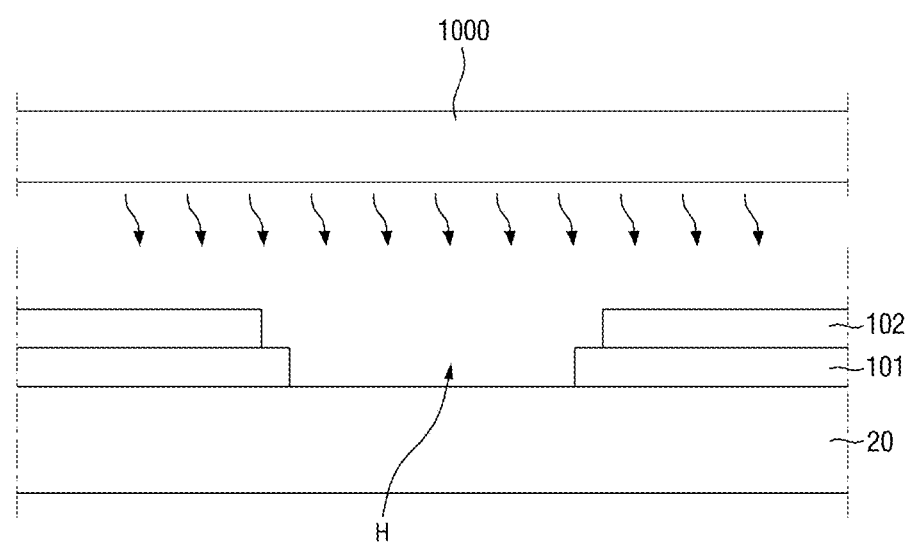
Figure 13:
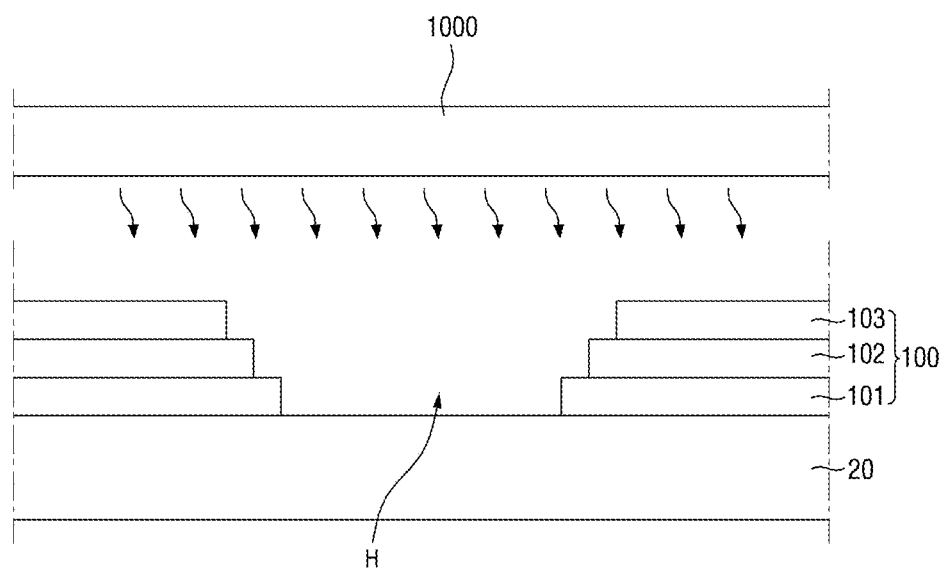
Figure 14:
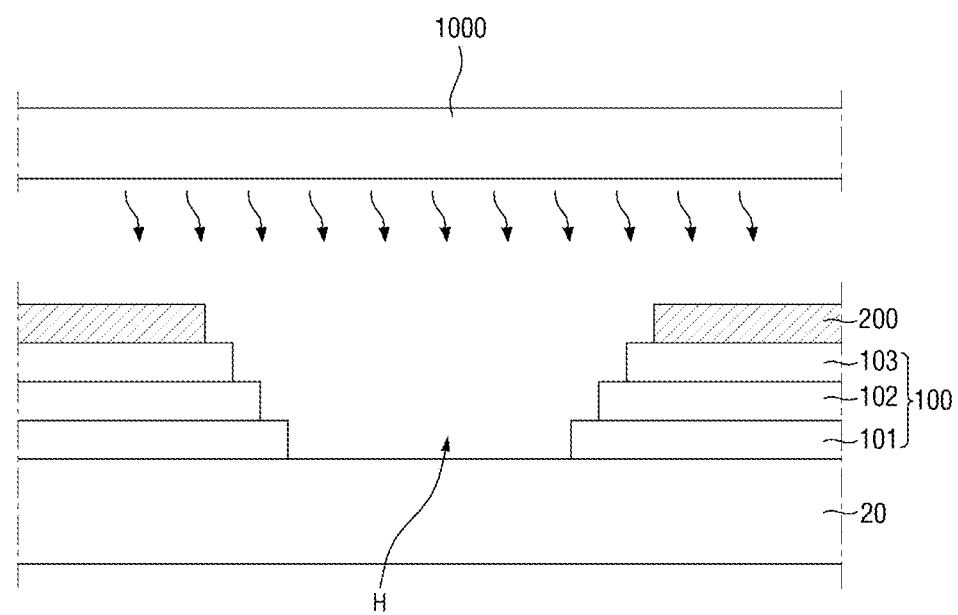

FIG. 10 is a flowchart illustrating a method of manufacturing a display device according to an exemplary embodiment. FIGS. 11 to 17 are cross-sectional views illustrating the method of manufacturing the display device according to the exemplary embodiment.

Referring to FIGS. 10 to 13, a plurality of decorative printing layers 101 to 103 are printed on a lower surface 20b of a window 20 and pre-dried to form a decorative print pattern 100 (S1 and S2). The decorative print pattern 100 may be formed in various methods such as screen printing, spray-UV exposure printing, silk printing, pad printing, and the like as described above. In the exemplary embodiment, the decorative print pattern 100 is formed by the pad printing method, but the present invention is not limited thereto.

The forming of the decorative print pattern 100 specifically includes printing a first decorative printing layer 101 and pre-drying using a pre-drier 1000, printing and pre-drying a second decorative printing layer 102 on the first decorative printing layer 101, and printing and pre-drying a third decorative printing layer 103 on the second decorative printing layer 102. The pre-drying requires about 10 seconds and each of the decorative printing layers 101 to 103 is not completely dried, but is dried and fixed so as to be suitable for performing the next step.

When each of the decorative printing layers 101 to 103 is printed, the printing is performed on the remaining region except for a region where a hole H is to be formed.

Next, referring to FIGS. 10 to 14, a shielding layer 200 is printed on the decorative print pattern 100 and the shielding layer 200 is pre-dried using a pre-drier 1000 (S3 and S4). The shielding layer 200 may be printed in the same manner as the decorative print pattern 100.

Figure 15:
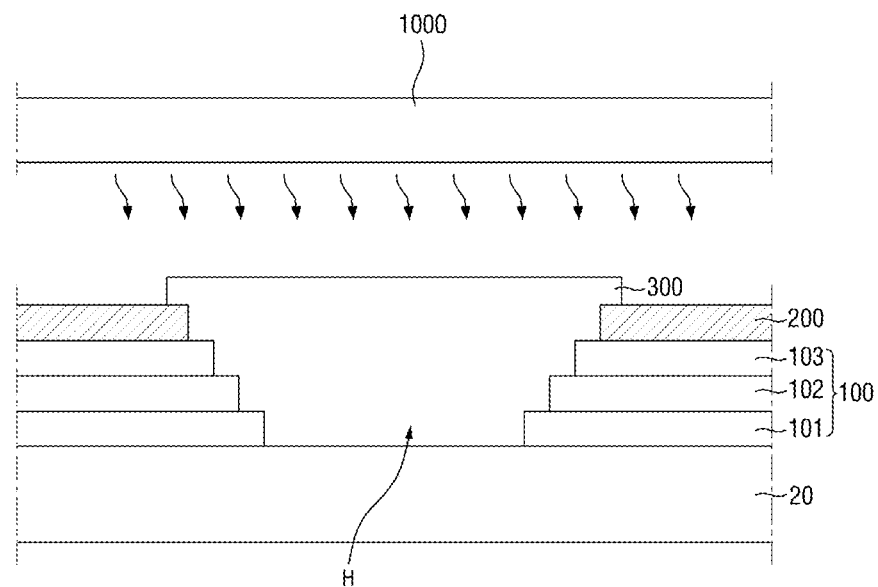

Thereafter, referring to FIGS. 10 and 15, a transparent printing layer 300 is formed to overlap the hole H and pre-dried (S5 and S6).

The transparent printing layer 300 may also be formed in the same manner as the decorative print pattern 100.

The transparent printing layer 300 covers the side surfaces of the decorative printing layers 101 to 103 and an exposed lower surface thereof and covers the side surface and a part of the lower surface of the shielding layer 200. As described above, since the transparent printing layer 300 has low permeability to the decorative printing layers 101 to 103 and is transparent, even if the decorative printing layers 101 to 103 subjected to only the pre-drying are in direct contact with the transparent printing layer 300, the transparent printing layer 300 does not have an effect on the color represented by the decorative printing layers 101 to 103.

Figure 16:
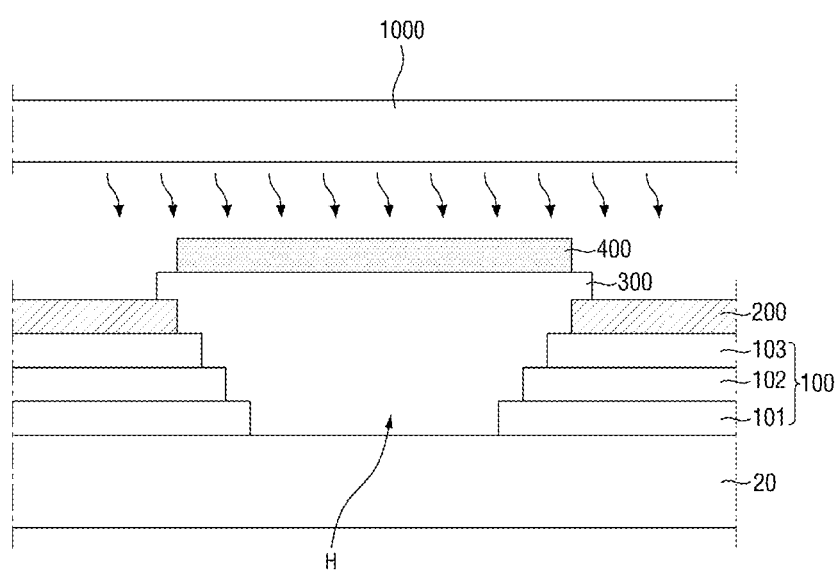

Next, referring to FIGS. 10 and 16, an infrared printing layer 400 is printed on the transparent printing layer 300 and pre-dried (S7 and S8).

The infrared printing layer 400 may also be formed in the same manner as the decorative print pattern 100.

The infrared printing layer 400 is in contact with the lower surface of the transparent printing layer 300 and is not in contact with the decorative print pattern 100. Furthermore, the infrared printing layer 400 may not be in contact with the shielding layer 200.

Since the infrared printing layer 400 has better permeability to the decorative print pattern 100 than the transparent printing layer 300, the infrared printing layer 400 is in direct contact with the decorative print pattern 100 to have an effect on the decorative print pattern 100. However, in the exemplary embodiment, since the transparent printing layer 300 is disposed between the infrared printing layer 400 and the decorative print pattern 100, the infrared printing layer 400 is not in direct contact with the decorative print pattern 100 such that the infrared printing layer 400 does not penetrate into the decorative print pattern 100.

The side surface of the infrared printing layer 400 may be disposed outside the side surface of the first decorative printing layer 101 based on the hole H. As described above, since light transmitted/received by an optical sensor overlapping the hole H passes through the infrared ray printing layer 400 and is filtered by light having a specific wavelength, most of the light passing through the hole H passes through the infrared printing layer 400, thereby increasing the sensing efficiency of the optical sensor.

Figure 17:
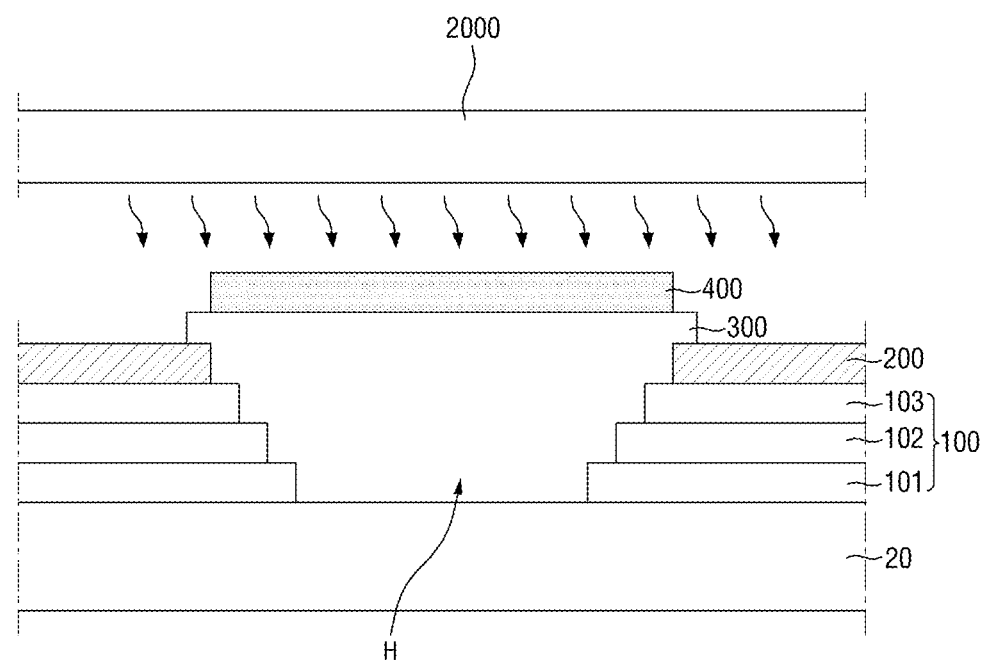

Thereafter, referring to FIGS. 10 and 17, the window 20 formed with the decorative print pattern 100, the shielding layer 200, the transparent printing layer 300 and the infrared printing layer 400 is dried using a drier 2000 (S9).

The drying is performed for a long time to completely dry the decorative print pattern 100, the shielding layer 200, the transparent printing layer 300 and the infrared printing layer 400, and a required time of the drying is longer than that of the pre-drying.

As such, after the decorative print pattern 100, the shielding layer 200, the transparent printing layer 300, and the infrared printing layer 400 are all formed, only one drying is performed, thereby simplifying a manufacturing process, reducing a manufacturing time, and reducing the costs.

Furthermore, the transparent print layer 300 is disposed between the decorative print pattern 100 and the infrared print layer 400 to prevent the decorative print pattern 100 from penetrating into the decorative print pattern 100 subjected to only the pre-drying.

As described above, according to the embodiments of the present invention, the infrared ink layer is not viewed from the outside of the display device. Further, the transmission/reception efficiency of the optical signal passing through the infrared ink layer may not be reduced.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device, comprising:
a window;
a decorative print pattern disposed on the window;
a shielding layer disposed on the decorative print pattern;
a first printing layer disposed on the shielding layer; and
a second printing layer disposed on the first printing layer and not in contact with the decorative print pattern,
wherein the first printing layer is transparent,
wherein the second printing layer comprises a material having relatively high transmittance in an infrared wavelength range and relatively low transmittance in a visible wavelength range, and
wherein the decorative print pattern and the shielding layer comprise a first opening exposing the window, and the first printing layer and the second printing layer overlap the first opening.

2. The display device of claim 1,
wherein the first printing layer covers an inner side wall of the decorative print pattern and an inner side wall of the shielding layer.

3. The display device of claim 2,
wherein a side surface of the first printing layer is disposed on the shielding layer.

4. The display device of claim 1,
wherein the second printing layer is in contact with the shielding layer.

5. The display device of claim 2,
wherein the second printing layer is not in contact with the shielding layer.

6. The display device of claim 4,
wherein a side surface of the second printing layer is disposed on the shielding layer.

7. The display device of claim 1,
wherein the decorative print pattern comprises a first decorative printing layer and a second decorative printing layer which are sequentially stacked on the window, and the first printing layer covers an inner side wall of the first decorative printing layer, an inner side wall of the second decorative printing layer, and the inner side wall of the shielding layer.

8. The display device of claim 7,
wherein a side surface of the second printing layer is disposed outside the inner side wall of the first decorative printing layer based on the first opening, from a cross sectional view.

9. The display device of claim 8,
wherein the side surface of the second printing layer is disposed between the inner side wall of the first decorative printing layer and the inner side wall of the shielding layer, from a cross sectional view.

10. The display device of claim 1,
wherein the decorative print pattern and the shielding layer further comprise a second opening and a third opening that expose the window and are spaced apart from each other, and the first printing layer and the second printing layer overlap the second opening and the third opening.

11. The display device of claim 10,
wherein the first printing layer comprises a first region overlapping the second opening and a second region overlapping the third opening, and the first region and the second region are continuously connected to each other.

12. The display device of claim 11,
wherein the second printing layer comprises a third region overlapping the second opening and a fourth region overlapping the third opening, and the third region and the fourth region are continuously connected to each other.

13. A display device comprising:
a window;
a decorative print pattern disposed on the window;
a first printing layer disposed on the decorative print pattern;
a shielding layer disposed on the first printing layer; and
a second printing layer disposed on the shielding layer and not in contact with the decorative print pattern,
wherein the first printing layer is transparent,
wherein the second printing layer comprises a material having relatively high transmittance in an infrared wavelength range and relatively low transmittance in a visible wavelength range, and
wherein the decorative print pattern comprises a first opening exposing the window, the shielding layer comprises a second opening overlapping the first opening, and the first printing layer and the second printing layer overlap the first opening and the second opening.

14. The display device of claim 13,
wherein the first printing layer covers an inner side wall and one surface of the decorative print pattern.

15. The display device of claim 14,
wherein a side surface of the second printing layer is disposed on the shielding layer.

16. The display device of claim 13,
wherein the decorative print pattern comprises a first decorative printing layer and a second decorative printing layer which are sequentially stacked on the window, and the first printing layer covers an inner side wall of the first decorative printing layer, an inner side wall of the second decorative printing layer, and one surface of the second decorative printing layer.

17. The display device of claim 16,
wherein a side surface of the second printing layer is disposed outside the inner side wall of the first decorative printing layer based on the first opening, from a cross sectional view.

18. The display device of claim 17,
wherein the side surface of the second printing layer is disposed between the inner side wall of the first decorative printing layer and the inner side wall of the shielding layer.

* * * * *